United States Patent
Hong et al.

(10) Patent No.: US 11,522,134 B2
(45) Date of Patent: Dec. 6, 2022

(54) RESISTIVE SWITCHING MEMORY INCLUDING RESISTIVE SWITCHING LAYER FABRICATED USING SPUTTERING AND METHOD OF FABRICATING THE SAME

(71) Applicant: IUCF-HYU (Industry-University Cooperation Foundation Hanyang University), Seoul (KR)

(72) Inventors: Jin Pyo Hong, Seoul (KR); Da Seul Hyeon, Daejeon (KR); Gwang Ho Baek, Incheon (KR); Gabriel Jang, Seoul (KR); Tae Yoon Kim, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 36 days.

(21) Appl. No.: 17/052,386

(22) PCT Filed: May 3, 2019

(86) PCT No.: PCT/KR2019/005300
§ 371 (c)(1),
(2) Date: Nov. 2, 2020

(87) PCT Pub. No.: WO2019/212272
PCT Pub. Date: Nov. 7, 2019

(65) Prior Publication Data
US 2021/0167286 A1 Jun. 3, 2021

(30) Foreign Application Priority Data
May 3, 2018 (KR) .......................... 10-2018-0051282

(51) Int. Cl.
*H01L 45/00* (2006.01)
*C23C 14/08* (2006.01)
(Continued)

(52) U.S. Cl.
CPC .......... *H01L 45/1625* (2013.01); *C23C 14/08* (2013.01); *C23C 14/54* (2013.01);
(Continued)

(58) Field of Classification Search
CPC ..... H01L 45/1625; H01L 43/12; H01L 45/08; H01L 45/1233; H01L 45/1253;
(Continued)

(56) References Cited

U.S. PATENT DOCUMENTS

2017/0110301 A1* 4/2017 Lee ................... H01J 37/32715

FOREIGN PATENT DOCUMENTS

KR       10-1422421 B      7/2014
KR    10-2015-0012543 A    2/2015
(Continued)

OTHER PUBLICATIONS

Kurt J. Lesker, Increasing Sputter Rates, 2010 (Year: 2010).*
(Continued)

*Primary Examiner* — Shih Tsun A Chou
(74) *Attorney, Agent, or Firm* — Sughrue Mion, PLLC

(57) ABSTRACT

Disclosed is a method of fabricating a resistive switching memory. A method of fabricating a resistive switching memory according to an embodiment of the present invention includes a step of forming a lower electrode on a substrate; a step of forming a resistive switching layer on the lower electrode using sputtering; and a step of forming an upper electrode on the resistive switching layer, wherein, in the step of forming a resistive switching layer on the lower electrode using sputtering, the substrate is disposed in a region, which is not reached by plasma generated by the first (Continued)

and second targets, between the first target and the second target disposed above the substrate to deposit the resistive switching layer.

10 Claims, 25 Drawing Sheets

(51) Int. Cl.
    *C23C 14/54*     (2006.01)
    *H01J 37/34*     (2006.01)

(52) U.S. Cl.
    CPC ...... *H01J 37/3417* (2013.01); *H01J 37/3426* (2013.01); *H01L 45/08* (2013.01); *H01L 45/1233* (2013.01); *H01L 45/1253* (2013.01); *H01L 45/146* (2013.01); *H01L 45/149* (2013.01)

(58) Field of Classification Search
    CPC ..... H01L 45/146; H01L 45/149; C23C 14/54; C23C 14/08
    See application file for complete search history.

(56) References Cited

FOREIGN PATENT DOCUMENTS

KR     10-2017-0045696 A     4/2017
KR     10-1764983 B     7/2017

OTHER PUBLICATIONS

Jae Bin Lee et al., Deposition of ZnO thin films by magnetron sputtering for a film bulk acoustic resonator, Thin Solid Films 435 (2003) 179-185 (Year: 2003).*

Daseul Hyeon et al., "Sputter growth of oxygenated amorphous caron for resistive random-access memory application", KPS Fall Meeting, Bulletin of the Korean Physical Society, Oct. 27, 2017, 14 pages.

International search report for PCT/KR2019/005300 dated Aug. 8, 2019.

* cited by examiner

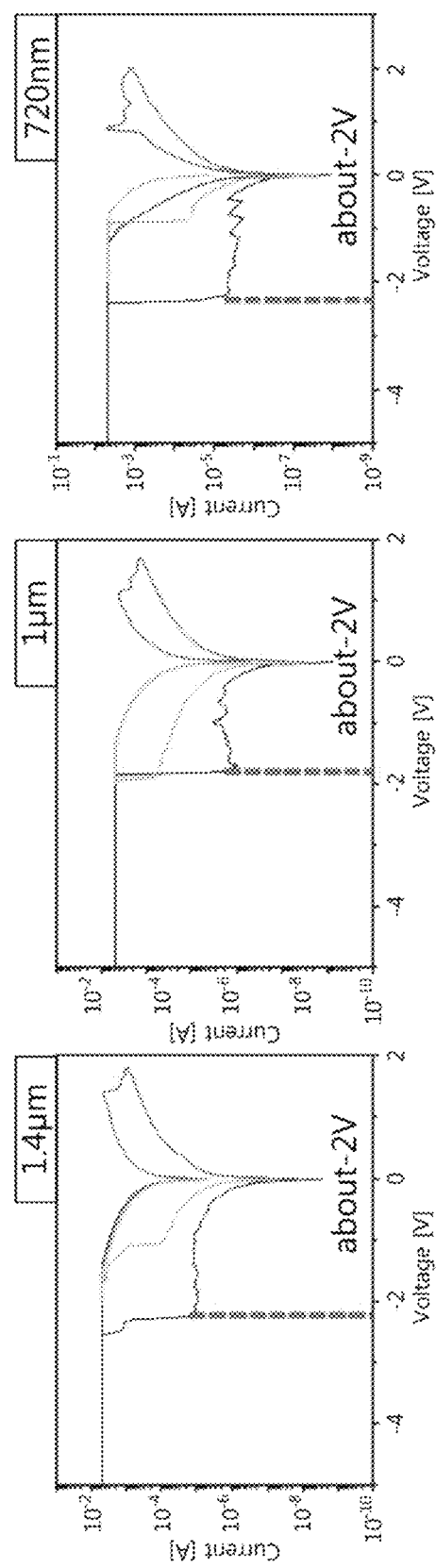

RESISTIVE SWITCHING MEMORY INCLUDING RESISTIVE SWITCHING LAYER FABRICATED USING SPUTTERING AND METHOD OF FABRICATING THE SAME

CROSS-REFERENCE TO RELATED APPLICATION

This application is a National Stage Entry of PCT International Application No. PCT/KR2019/005300, which was filed on May 3, 2019, and which claims priority to Korean Patent Application No. 10-2018-0051282, filed on May 3, 2018 in the Korean Intellectual Property Office, the disclosure of which is incorporated herein by reference.

TECHNICAL FIELD

The present invention relates to a resistive switching memory including a resistive switching layer fabricated using sputtering and a method of fabricating the resistive switching memory, and more particularly, to a resistive switching memory that includes a resistive switching layer fabricated using sputtering and, through adjustment of the density of plasma around a substrate, has a controlled thin film thickness and exhibits controlled thin film defects, and a method of fabricating the resistive switching memory.

BACKGROUND ART

Several methods of depositing a material on a substrate are known. For example, substrates may be deposited by a physical vapor deposition (PVD) process such as a sputtering process. As other deposition processes, there are chemical vapor deposition (CVD) and plasma enhanced chemical vapor deposition (PECVD). Typically, the processes are carried out in apparatuses or sputtering chambers for processing, a substrate to be coated is placed in the apparatuses or sputtering chambers, and a deposition material is provided in the sputtering chambers.

The deposited materials can be used in some applications and in some fields of technology, for example, to form a resistive switching layer that is included in a resistive switching memory.

As an example of sputtering apparatuses, a magnetron sputtering apparatus wherein an electromagnet or a permanent magnet is disposed on a back surface of a target, a ring-shaped magnetron discharge plasma is generated on a target surface to sputter the target, and the sputtered object is deposited on a substrate to form a film is known.

However, an existing sputtering method has difficulties in that the plasma density applied to a substrate is very high because the substrate is placed directly under a target, and it is difficult to control the concentrations of electrons or reactive ions present in plasma because the plasma density generated between the substrate and the target is constant.

For example, when carbon oxide (COx) is deposited using reactive sputtering, carbon reacts with electrons or oxygen-reactive ions present in plasma to be bonded in the form of CO or $CO_2$, so that carbon oxide (COx) is not deposited on a substrate, and a deposited thin carbon film is etched without formation of a thin carbon oxide film.

DISCLOSURE

Technical Problem

Therefore, the present invention has been made in view of the above problems, and it is one object of the present invention to adjust the density of plasma by disposing a substrate in a region, which is not reached by plasma generated by first and second targets, between the first target and the second target disposed above a substrate, thereby adjusting the concentration of electrons or reactive ions generated in plasma.

It is another object of the present invention to adjust the density of plasma by disposing a substrate in a region, which is not reached by plasma generated by the first and second targets, between the first target and the second target disposed above a substrate, thereby controlling the thickness of a resistive switching layer.

It is still another object of the present invention to control the composition of the resistive switching layer by depositing the resistive switching layer using the first target and the second target.

It is still another object of the present invention to control a deposition rate of the resistive switching layer and improve process efficiency by adjusting a first distance (width), in a horizontal direction, between the substrate and the first and second targets and a second distance (height), in a vertical direction, between the substrate and the first and second targets.

Technical Solution

In accordance with an aspect of the present invention, the above and other objects can be accomplished by the provision of a method of fabricating a Resistive Random Access Memory (ReRAM), the method including: a step of forming a lower electrode on a substrate; a step of forming a resistive switching layer on the lower electrode using sputtering; and a step of forming an upper electrode on the resistive switching layer, wherein, in the step of forming a resistive switching layer on the lower electrode using sputtering, the substrate is disposed in a region, which is not reached by plasma generated by the first and second targets, between the first target and the second target disposed above the substrate to deposit the resistive switching layer.

In the step of forming a resistive switching layer on the lower electrode using sputtering, a thickness of the resistive switching layer may be controlled by adjusting a density of plasma applied to the substrate.

A deposition rate of the resistive switching layer may be controlled by adjusting a first distance, in a horizontal direction, between the first or second target and the substrate.

A deposition rate (growth rate) of the resistive switching layer may be controlled by adjusting a second distance, in a vertical direction, between the first or second target and the substrate.

The step of forming a resistive switching layer on the lower electrode using sputtering may be carried out in an oxygen atmosphere.

The density of plasma applied to the substrate may be $10^{13}$ ions/m³ to $10^{17}$ ions/m³.

The first distance, in a horizontal direction, between the first or second target and the substrate may be 1 cm to 5 cm.

The second distance, in a vertical direction, between the first or second target and the substrate may be 5 cm to 20 cm.

The first target and the second target may be made of the same material.

The first and second targets may include at least one of graphite, carbon (C), silicon (Si), copper (Cu), nickel (Ni), titanium (Ti), hafnium (Hf), zirconium (Zr), zinc (Zn), tungsten (W), cobalt (Co), niobium (Nb), magnesium (Mg), oxygenated carbon (COx), silicon oxide, copper oxide, nickel oxide, titanium oxide, hafnium oxide, zirconium oxide, zinc oxide, tungsten oxide, cobalt oxide, niobium oxide and magnesium oxide.

The resistive switching layer may include at least one of oxygenated carbon (COx) and metal oxide.

The lower and upper electrodes may include at least one of titanium nitride (TiN), tantalum nitride (TaN), tungsten (W), platinum (Pt), aluminum (Al), silver (Ag), copper (Cu) and ruthenium (Ru).

In accordance with another aspect of the present invention, there is provided a resistive switching memory, including: a lower electrode formed on a substrate; a resistive switching layer formed on the lower electrode using sputtering; and an upper electrode formed on the resistive switching layer, wherein the substrate is disposed in a region, which is not reached by plasma generated by the first and second targets, between the first target and the second target disposed above the substrate to deposit the resistive switching layer.

A thickness of the resistive switching layer may be controlled by adjusting a density of plasma applied to the substrate.

A deposition rate of the resistive switching layer may be controlled by adjusting a first distance, in a horizontal direction, between the first or second target and the substrate.

A deposition rate (growth rate) of the resistive switching layer may be controlled by adjusting a second distance, in a vertical direction, between the first or second target and the substrate.

Advantageous Effects

In accordance with an embodiment of the present invention, the density of plasma can be adjusted by disposing a substrate in a region, which is not reached by plasma generated by first and second targets, between the first target and the second target disposed above a substrate, thereby being capable of adjusting the concentration of electrons or reactive ions generated in plasma.

In accordance with an embodiment of the present invention, the density of plasma can be adjusted by disposing a substrate in a region, which is not reached by plasma generated by the first and second targets, between the first target and the second target disposed above a substrate, thereby being capable of controlling the thickness of a resistive switching layer.

In accordance with an embodiment of the present invention, the composition of the resistive switching layer can be adjusted by depositing the resistive switching layer using the first target and the second target.

In accordance with an embodiment of the present invention, by adjusting a first distance (width), in a horizontal direction, between the substrate and the first and second targets and a second distance (height), in a vertical direction, between the substrate and the first and second targets, a deposition rate of the resistive switching layer can be controlled and process efficiency can be improved.

DESCRIPTION OF DRAWINGS

FIG. 8A illustrates cell size-dependent forming voltages of a resistive switching memory according to Example 2 of the present invention.

BEST MODE

Figure 1A:
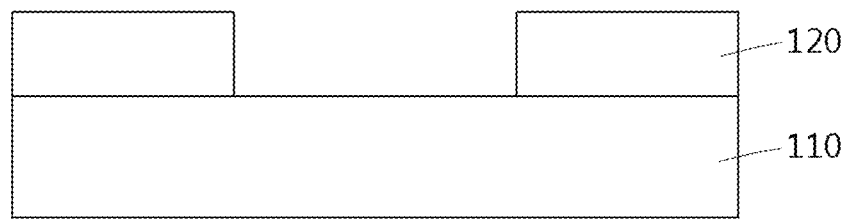
FIGS. 1A to 1F are sectional views illustrating a method of fabricating a resistive switching memory according to an embodiment of the present invention.

The present disclosure will now be described more fully with reference to the accompanying drawings and contents disclosed in the drawings. However, the present disclosure should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context. It will be further understood that the terms "comprise" and/or "comprising", when used in this specification, specify the presence of stated components, steps, operations, and/or elements, but do not preclude the presence or addition of one or more other components, steps, operations, and/or elements thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the disclosure and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Meanwhile, terms such as "first" and "second" are used herein merely to describe a variety of constituent elements, but the constituent elements are not limited by the terms. The terms are used only for the purpose of distinguishing one constituent element from another constituent element.

In addition, when an element such as a layer, a film, a region, and a constituent is referred to as being "on" another element, the element can be directly on another element or an intervening element can be present.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In addition, in the following description of the present disclosure, a detailed description of known functions and configurations incorporated herein will be omitted when it may make the subject matter of the present disclosure unclear. The terms used in the specification are defined in consideration of functions used in the present disclosure, and can be changed according to the intent or conventionally used methods of clients, operators, and users. Accordingly, definitions of the terms should be understood on the basis of the entire description of the present specification.

FIGS. 1A to 1F are sectional views illustrating a method of fabricating a resistive switching memory according to an embodiment of the present invention.

The method of fabricating a resistive switching memory according to an embodiment of the present invention includes a step of forming a lower electrode 130 on a substrate 110, a step of forming a resistive switching layer 150 on the lower electrode 130 using sputtering, and a step of forming an upper electrode 160 on the resistive switching layer 150.

In addition, in the step of forming a resistive switching layer 150 on the lower electrode 130 using sputtering, the substrate 110 is disposed in a region, which is not reached by plasma generated by first and second targets, between the first target and the second target, which are disposed above the substrate 110, to deposit the resistive switching layer 150.

Accordingly, in the method of fabricating a resistive switching memory according to an embodiment of the present invention, the substrate 110 is disposed in a region, which is not reached by plasma generated by first and second targets, between the first target and the second target, which are disposed above the substrate 110, so that the density of plasma can be adjusted to control the concentration of electrons or reactive ions generated in plasma.

Figure 1B:
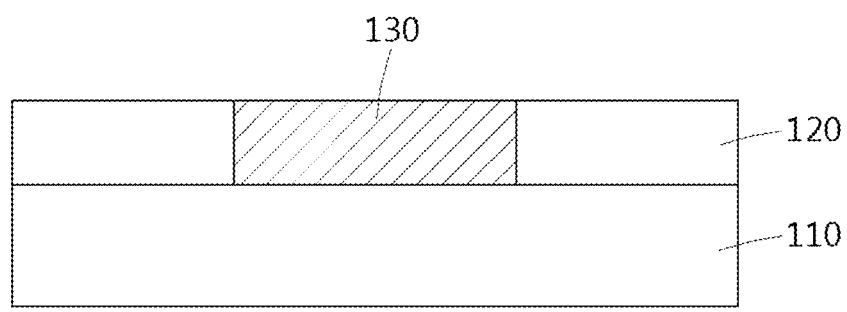

FIGS. 1A and 1B are sectional views illustrating a process of forming a lower electrode on a substrate of the method of fabricating a resistive switching memory according to an embodiment of the present invention.

The method of fabricating a resistive switching memory according to an embodiment of the present invention includes a step of forming the lower electrode 130 on the substrate 110.

The substrate 110, which is a base substrate for forming a resistive switching memory, is a substrate generally used in the art, and may be made of various materials, such as silicon, glass, quartz, plastic, or metal foil, without specific limitation.

For example, a plastic substrate including at least one of polyethylene terephthalate (PET), polyethylene naphthalate (PEN), polypropylene (PP), polycarbonate (PC), polyamide (PI), tri acetyl cellulose (TAC) and polyethersulfone (PES), or a flexible substrate including at least one of aluminum foil and stainless steel foil may be used.

A lower electrode 120 may be formed on the substrate 110, the upper electrode 160 may be disposed to be spaced apart from the lower electrode 120, and a predetermined voltage may be applied to both ends of the lower electrode 120 or the upper electrode 160 to change a resistance state of a resistive switching layer 13.

The lower electrode 130 may be formed by depositing the first insulating layer 120 on the substrate 110, and then forming a photoresist pattern on the first insulating layer 120, and then selectively etching, i.e., patterning, the first insulating layer 120 using a photoresist pattern as a mask to form a first opening, and then depositing a material for forming the lower electrode 130 on the first opening.

In addition, the width of the first opening is an important factor in determining a cell size. The lower electrode 130 may include at least one of titanium nitride (TiN), tantalum nitride (TaN), tungsten (W), platinum (Pt), aluminum (Al), silver (Ag), copper (Cu) and ruthenium (Ru).

The lower electrode 130 may be formed using at least one of vacuum deposition, chemical vapor deposition, physical vapor deposition, atomic layer deposition, organic metal chemical vapor deposition, plasma-enhanced chemical vapor deposition, molecular beam epitaxy, hydride vapor phase epitaxy, sputtering, spin coating, dip coating and zone casting.

Figure 1C:
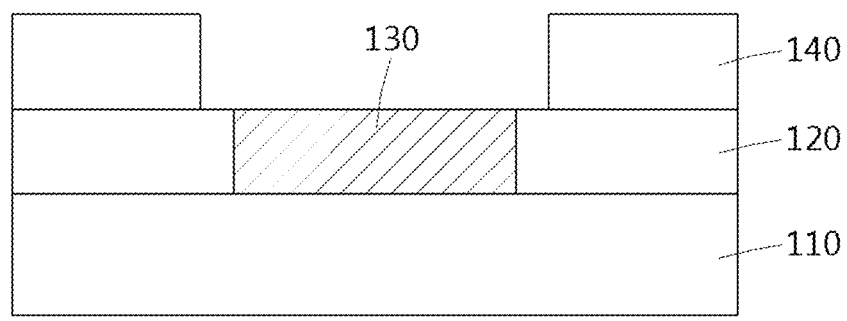
Figure 1D:
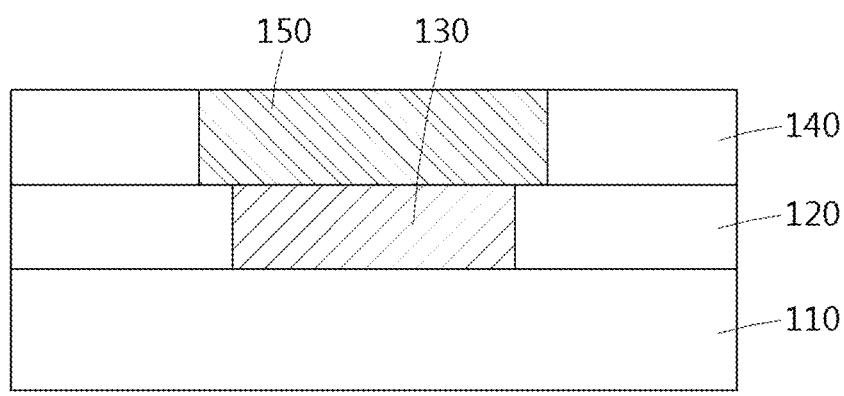

FIGS. 1C and 1D are sectional views illustrating a process of forming a resistive switching layer on a lower electrode of the method of fabricating a resistive switching memory according to an embodiment of the present invention.

The method of fabricating a resistive switching memory according to an embodiment of the present invention includes a step of forming a resistive switching layer 150 on the lower electrode 130 using sputtering.

A resistance state of the resistive switching layer 150 may be changed due to the formation and disappearance of a metal filament according to voltage application. For example, a metal filament may be formed and disappeared by a redox reaction of oxygen ions inside the resistive switching layer 150.

The resistive switching layer 150 may be formed by depositing the photoresist 140 on the lower electrode 130 and the first insulating layer 120, and then selectively etching, i.e., patterning, the photoresist 140 to form a second opening, and then depositing a material for forming the resistive switching layer 150 on the second opening. The second opening may be formed in a region corresponding to the first opening.

Now, the technique of forming the resistive switching layer 150 using sputtering is described in detail with reference to FIG. 2.

Figure 2:
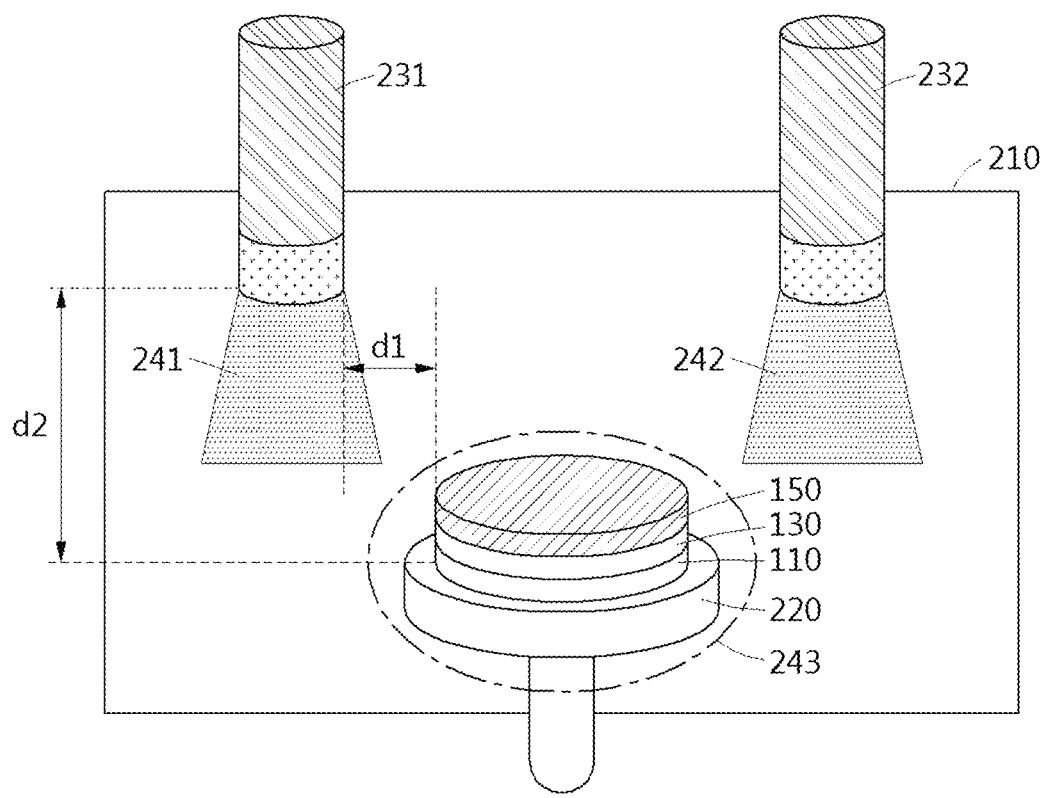
FIG. 2 is a schematic view illustrating a sputtering apparatus used in a method of fabricating a resistive switching memory according to an embodiment of the present invention.

FIG. 2 is a schematic view illustrating a sputtering apparatus used in a method of fabricating a resistive switching memory according to an embodiment of the present invention.

Referring to FIG. 2, a sputtering chamber 210 includes a holder 220 on which a substrate is to be disposed, and two targets 231 and 232 arranged at positions opposite to the holder 220. Here, sputtering is one type of physical vapor deposition (PVD).

The sputtering apparatus may be at least one of a DC diode type system, a radio frequency (RF) sputtering apparatus, a magnetron sputtering apparatus and an ionized metal plasma (IPM) sputtering apparatus.

By sputtering, high-energy particles collide with solid slabs of the first and second targets 231 and 232 that provide a high-purity target material and physically dislodge atoms of the first and second targets 231 and 232. Sputtered atoms generally move under vacuum and are deposited on a deposition surface (e.g., a surface of the lower electrode 130).

High-energy particles (e.g., high-density cations) may be introduced into the sputtering chamber 210 through a gas delivery tube from argon gas glow discharge so as to sputter a material from the first and second targets 231 and 232.

Sputtering may be started by generating charged high-energy particles, such as positively-charged argon ions, in first and second plasma regions 241 and 241 of the high-vacuum sputtering chamber 210, followed by accelerating charged high-energy particles in a target material (the first and second targets 231 and 232) having an opposite potential such as a negatively-charged target material.

During acceleration, high-energy particles (e.g., high-density cations) accumulate momentum and collide with the first and second targets 231 and 232. The high-energy particles (e.g., high-density cations) physically dislodge atoms from the first and second targets 231 and 232, and the dislodged atoms of the first and second targets 231 and 232 move to a deposition surface (e.g., a surface of the lower electrode 130).

The atoms of the first and second targets 231 and 232 are condensed to form a thin film, which essentially has the same material composition as in the first and second targets 231 and 232, on a deposition surface 45. Excess material is removed from the sputtering chamber 210, which includes the substrate 110, through an exhaust tube by a vacuum pump.

In addition, in the sputtering process, the holder 220, on which the substrate 110 is to be disposed, may be formed between the first and second targets 231 and 232 disposed above the substrate 110, i.e., may be formed in a region which is not reached by plasma generated by the first and second targets 231 and 232.

In general, plasma may be generated under the first and second targets 231 and 232 by applying voltage between the substrate 110 and the first target 231 and between the substrate 110 and the second target 232. More particularly, when voltage is applied to the first and second targets 231 and 232 through a power supply in a situation where a vacuum atmosphere is formed inside the sputtering chamber 210, plasma may be generated around the first and second targets 231 and 232. Here, plasma is generated by gas injected into the sputtering chamber 210. As an example of a gas, argon (Ar) or oxygen ($O_2$) may be used.

Accordingly, plasma regions in the sputtering chamber 210 used in the method of fabricating a resistive switching memory according to an embodiment of the present invention may include a high-density first plasma region 241 formed under the first target 231, a high-density second plasma region 242 formed under the second target 232 and a low-density third plasma region 242 formed between the first and second targets 231 and 232.

In the case of an existing sputtering method, the substrate 110 is disposed in a high-density plasma region that is under a target and is near a part where plasma is generated, so that the density of plasma generated between the substrate 110 and the target is constant and, accordingly, it is difficult to control the concentration of electrons or reactive ions included in plasma. Such electrons may cause defects on a thin film.

However, since deposition is carried out in a low-density third plasma region 243 having a low plasma density by the method of fabricating a resistive switching memory according to an embodiment of the present invention, a uniform thin film may not be formed, and defects on a thin film due to electrons may be prevented by reducing the concentration of electrons around a substrate.

In addition, the concentration of electrons and reactive ions around the substrate 110 is controlled by adjusting the density of plasma applied to the substrate 110 by the method of fabricating a resistive switching memory according to an embodiment of the present invention, so that the thickness of the resistive switching layer 150 formed on the substrate 110 (preferably, on the lower electrode 130) may be controlled.

The density of plasma in the third plasma region 243 which is applied to the substrate 110 may be $10^{13}$ ions/m$^3$ to $10^{17}$ ions/m$^3$. When the density of plasma in the third plasma region 243 which is applied to the substrate 110 is $10^{13}$ ions/m$^3$ or less, a reactive gas may not sufficiently react with a thin film, so that a thin film having a desired composition may not be formed. When the density of plasma in the third plasma region 243 which is applied to the substrate 110 exceeds $10^{17}$ ions/m$^3$, the density of plasma excessively increases, so that defects may be generated on the resistive switching layer 150 due to high-energy ions and electrons, or a material, which is changed in a gas form, may not be deposited (e.g., $C+O_2$àCO$_2$) due to reaction between a stacked thin film and a large number of reactive gases.

In addition, by the method of fabricating a resistive switching memory according to an embodiment of the present invention, the resistive switching layer 150 may be deposited in the low-density third plasma region 243 formed between the first and second targets 231 and 232, thereby increasing a deposition rate (growth rate).

More particularly, a first distance d1 in a horizontal direction between the first target 231 or the second target 232 and the substrate 110 may be adjusted by the method of fabricating a resistive switching memory according to an embodiment of the present invention, so that a deposition rate of the resistive switching layer 150 may be controlled.

The first distance (interval, d1) in a horizontal direction between the first or second target and the substrate 110 may be 1 cm to 5 cm. When the first distance d1 in a horizontal direction between the first or second target and the substrate 110 is 1 cm or less, the density of plasma may excessively increase, so that defects may be generated on the resistive switching layer 150. When the first distance d1 in a horizontal direction between the first or second target and the substrate 110 exceeds 5 cm, a deposition rate may be decreased.

In addition, the second distance (d2) in a vertical direction between the first or second target 231 or 232 and the substrate 110 may be adjusted by the method of fabricating a resistive switching memory according to an embodiment of the present invention, so that a deposition rate of the resistive switching layer 150 may be controlled.

The density of plasma may be adjusted according to the second distance (height; d2) in a vertical direction between the first and second targets 231 and 232 and the substrate 110. For example, the density of plasma may increase as the second distance (d2) in a vertical direction between the first and second targets 231 and 232 and the substrate 110 decreases, and the density of plasma may be reduced as the second distance (d2) in a vertical direction between the first and second targets 231 and 232 and the substrate 110 increases.

Accordingly, the second distance (d2) in a vertical direction between the first or second target 231 or 232 and the substrate 110 may affect the density of plasma applied to the substrate 110.

The second distance (d2) in a vertical direction between the first or second target 231 or 232 and the substrate 110 may be 5 cm to 20 cm. When the second distance (d2) in a vertical direction between the first or second target 231 or 232 and the substrate 110 is 5 cm or less, the density of plasma excessively increases, so that defects may be generated on the resistive switching layer 150. When the second distance (d2) in a vertical direction between the first and second targets 231 and 232 and the substrate 110 exceeds 20 cm, a deposition rate may be decreased.

The process of forming the resistive switching layer 150 using sputtering of the method of fabricating a resistive switching memory according to an embodiment of the present invention may be carried out in an oxygen atmosphere.

In addition, the resistive switching layer 150 may be deposited using the first and second targets 231 and 232 by the method of fabricating a resistive switching memory according to an embodiment of the present invention, so that the composition of the resistive switching layer 150 may be adjusted.

The first and second targets 231 and 232 may include at least one of graphite, carbon (C), silicon (Si), copper (Cu), nickel (Ni), titanium (Ti), hafnium (Hf), zirconium (Zr), zinc (Zn), tungsten (W), cobalt (Co), niobium (Nb), magnesium (Mg), oxygenated carbon (COx), silicon oxide, copper oxide, nickel oxide, titanium oxide, hafnium oxide, zirconium oxide, zinc oxide, tungsten oxide, cobalt oxide, niobium oxide and magnesium oxide, and the first and second targets 231 and 232 may be made of the same material.

Referring to FIG. 1D again, the resistive switching layer 150 may include at least one of oxygenated carbon (COx) and metal oxide. For example, the metal oxide may include at least one of silicon oxide, copper oxide, nickel oxide, titanium oxide, hafnium oxide, zirconium oxide, zinc oxide, tungsten oxide, cobalt oxide, niobium oxide and magnesium oxide.

Preferably, oxygenated carbon (COx) may be used in the resistive switching layer 150.

Oxygenated carbon (COx) may be prepared at room temperature, and has the advantage of being capable of easily controlling chemical, optical, and electrical properties.

Accordingly, when oxygenated carbon (COx) is used to prepare the resistive switching layer 150, a resistive switching memory may be fabricated at a low temperature, fast switching characteristics may be realized, and a cell size may be reduced.

In addition, since the resistive switching layer 150 is deposited in the low-density plasma region between the first target and the second target by the method of fabricating a resistive switching memory according to an embodiment of the present invention, carbon reacts with electrons or oxygen-reactive ions inside plasma to be bonded in the form of CO or $CO_2$, thereby being capable of addressing the problems that deposition is not carried out on the substrate 110 (preferably, the upper electrode 130) or the deposited resistive switching layer 150 is etched.

Figure 1E:
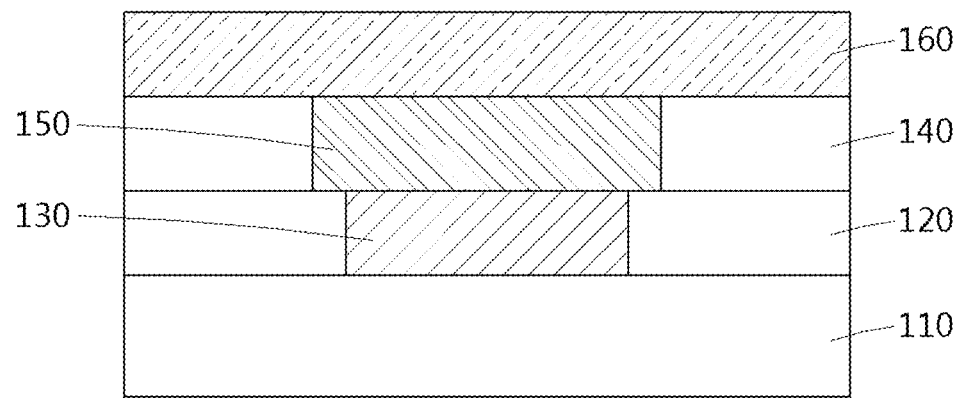

FIG. 1E is a sectional view illustrating an upper electrode formed on a resistive switching layer.

The method of fabricating a resistive switching memory according to an embodiment of the present invention includes a step of forming the upper electrode 160 on the resistive switching layer 150.

The upper electrode 160 may include at least one of titanium nitride (TiN), tantalum nitride (TaN), tungsten (W), platinum (Pt), aluminum (Al), silver (Ag), copper (Cu) and ruthenium (Ru).

The upper electrode 160 may be formed using at least one of vacuum deposition, chemical vapor deposition, physical vapor deposition, atomic layer deposition, organic metal chemical vapor deposition, plasma-enhanced chemical vapor deposition, molecular beam epitaxy, hydride vapor phase epitaxy, sputtering, spin coating, dip coating and zone casting.

Figure 1F:
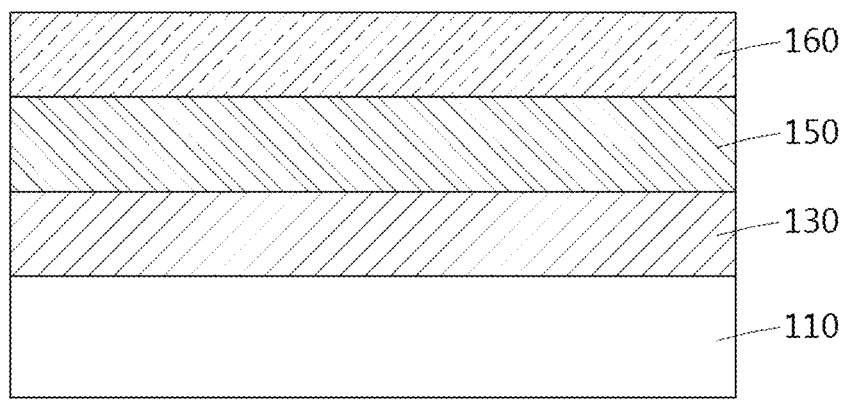

FIG. 1F is a sectional view illustrating a resistive switching memory according to an embodiment of the present invention.

According to the method of fabricating a resistive switching memory according to an embodiment of the present invention, the upper electrode 160 is formed on the resistive switching layer 150, and then all layers are patterned to correspond to the first opening, thereby obtaining the resistive switching memory according to an embodiment of the present invention from which the first insulating layer 120 and the photoresist 140 are removed. Here, a substrate may be removed together depending on user's choice.

Accordingly, a resistive switching memory 101 according to an embodiment of the present invention having a cell size of 720 nm to 1.4 μm may be fabricated by the method of fabricating a resistive switching memory according to an embodiment of the present invention. When a cell size of the resistive switching memory 101 according to an embodiment of the present invention is 720 nm or less, a yield may be decreased. When a cell size of the resistive switching memory 101 according to an embodiment of the present invention exceeds 1.4 μm, switching characteristics may be deteriorated.

The resistive switching memory 101 according to an embodiment of the present invention includes the lower electrode 130 formed on the substrate 110, the resistive switching layer 150 formed on the lower electrode 130 using sputtering, and the upper electrode 160 formed on the resistive switching layer 150.

The resistive switching layer 150 of the resistive switching memory according to an embodiment of the present invention may be fabricated using sputtering. By the sputtering, the substrate 110 is disposed in a region, which is not reached by plasma generated by first and second targets, between the first target and the second target that are disposed above the substrate 110, thereby depositing the resistive switching layer 150.

The substrate 110 of the resistive switching memory according to an embodiment of the present invention is disposed in a region, which is not reached by plasma generated by the first and second targets, between the first target and the second target that are disposed above the substrate, so that the thickness of the resistive switching layer 150 may be controlled by adjusting the density of plasma.

The density of plasma applied to the substrate 110 may be $10^{13}$ ions/m$^3$ to $10^{17}$ ions/m$^3$. When the density of plasma applied to the substrate 110 is $10^{13}$ ions/m$^3$ or less, a deposition rate may be decreased. When the density of plasma in the third plasma region 243 which is applied to the substrate 110 exceeds $10^{17}$ ions/m$^3$, the density of plasma excessively increases, so that defects may be generated on the resistive switching layer 150.

The thickness of the resistive switching layer 150 may be 5 nm to 10 nm. When the thickness of the resistive switching layer 150 is 5 nm or less, upper and lower electrodes may be connected to each other due to initial defects of the resistive switching layer 150. When the thickness of the resistive switching layer 150 exceeds 20 nm, there is a problem that a very large voltage should be applied in an initial forming step.

FABRICATION EXAMPLE

Example 1

Two carbon targets were installed at the same height, and a holder was placed in the middle of the targets. A substrate made of silicon (Si) and silicon oxide (SiOx) was mounted on the holder, and a-Cox was deposited by oxygen reactive sputtering.

During oxygen reactive sputtering, an oxygen ratio in the deposited a-COx thin film was changed to confirm that the thin film was formed in the form of a-COx.

Example 2

Figure 3A:
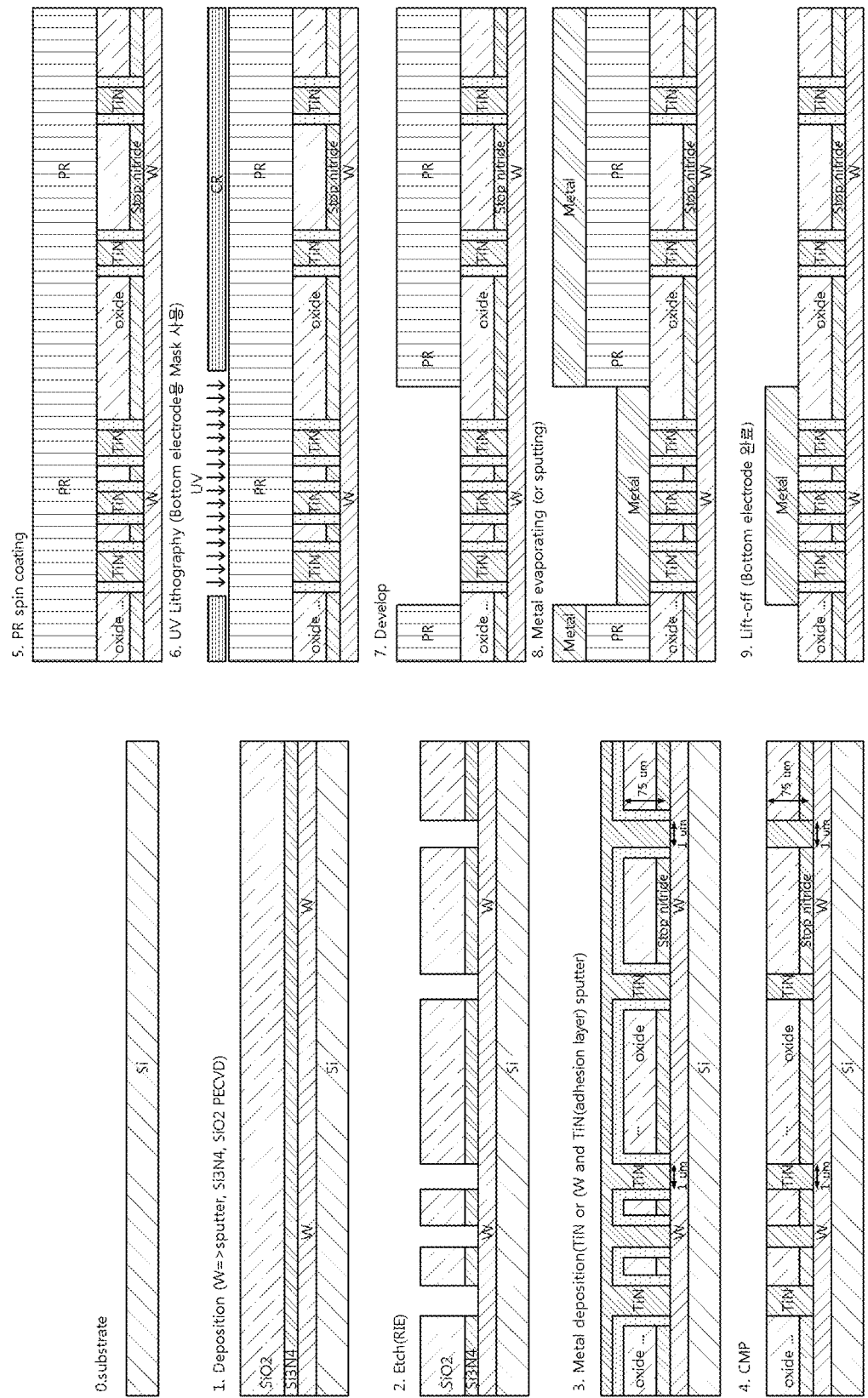
FIGS. 3A and 3B illustrate a method of fabricating a resistive switching memory according to Example 2 of the present invention.
Figure 3B:
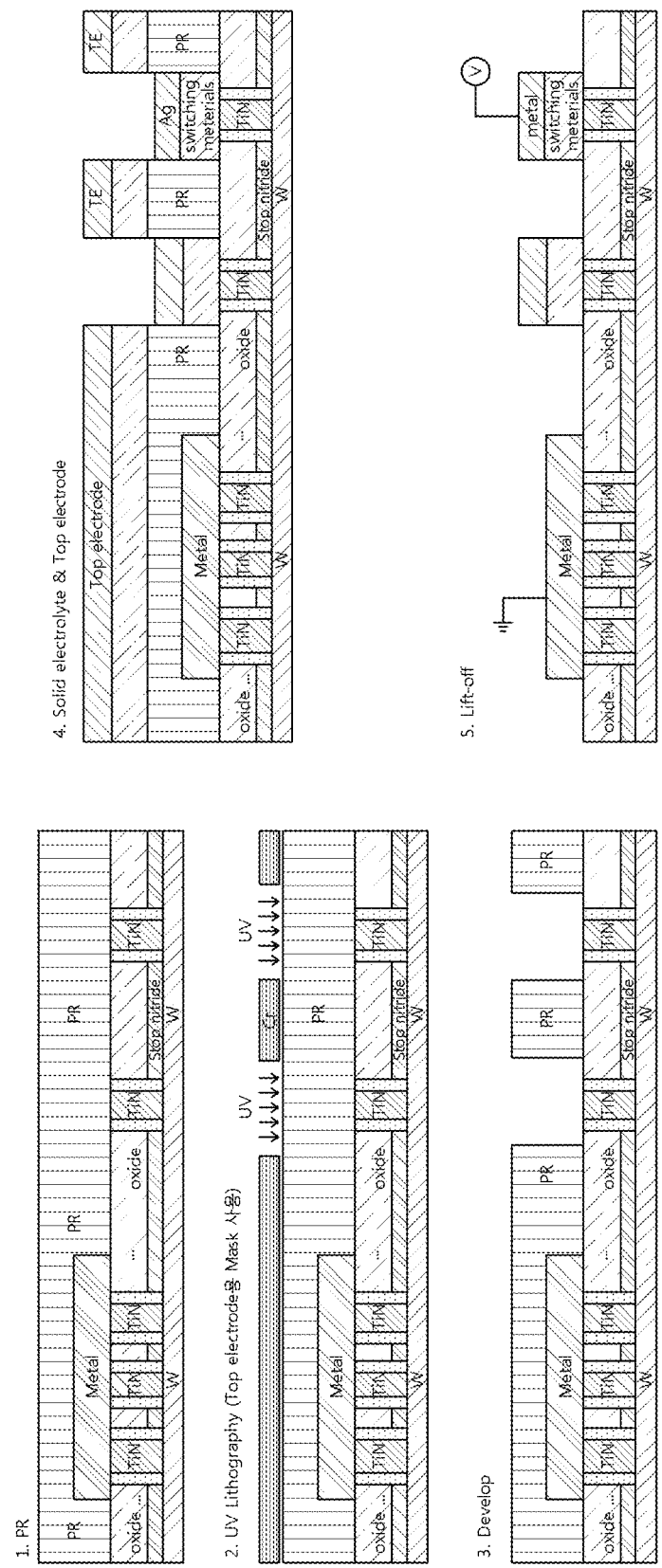

As shown in FIGS. 3A and 3B, a resistive switching memory (ReRAM) device having a Metal-Insulator-Metal (MIM) structure based on a-Cox was fabricated. That is, a resistive switching memory having a general Metal-Insulator-Metal (MIM) structure was fabricated.

"Nanowafer" provided with a lower electrode (bottom electrode) having several cell sizes was fabricated. The nanowafer was fabricated by depositing tungsten (W) to a thickness of ~50 nm on a silicon (Si) substrate through sputtering, and then depositing SiN (20 nm) and SiO$_2$ (50 nm) using chemical vapor deposition (CVD).

Next, a contact hole of 34 nm to 1,921 nm was formed using photolithography and Reactive-Ion Etching (RIE), and the contact hole was filled with tungsten (W) through sputtering, followed by flattening through CMP until about 700 nm of SiO$_2$ remained.

Next, a photoresist was spin-coated to a thickness of 5 μm, and an opening of ~60 μm was formed through a developer. In such a manner, a nanowafer was fabricated.

Pattering was carried out on the nanowafer using a mask through photolithography, and a Metal-Insulator-Metal (MIM) structure having a general RaRAM was sequentially formed on the patterned nanowafer. The fabricated nanowafer was deposited with a-COx (resistive switching layer) through oxygen reactive sputtering using carbon double targets in the same manner as in Example 1.

Pt, as an upper electrode (top electrode), was deposited to a thickness of 50 nm on the a-COx, and a part patterned by photolithography was removed through lift off, thereby fabricating a resistive switching memory (MIM ReRAM) having a desired sell size.

Figure 4A:
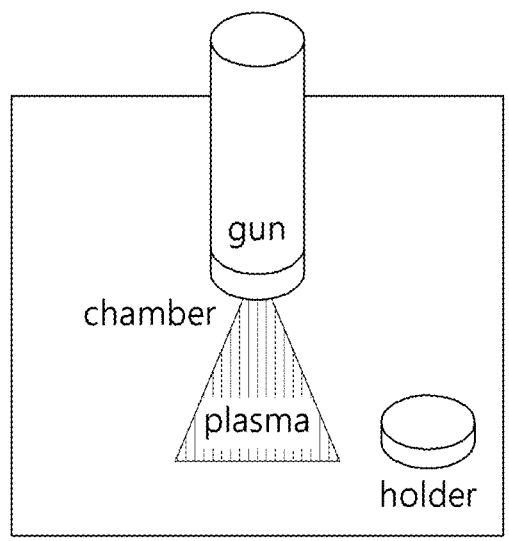
FIG. 4A illustrates a sputtering chamber provided with a single target.
Figure 4B:
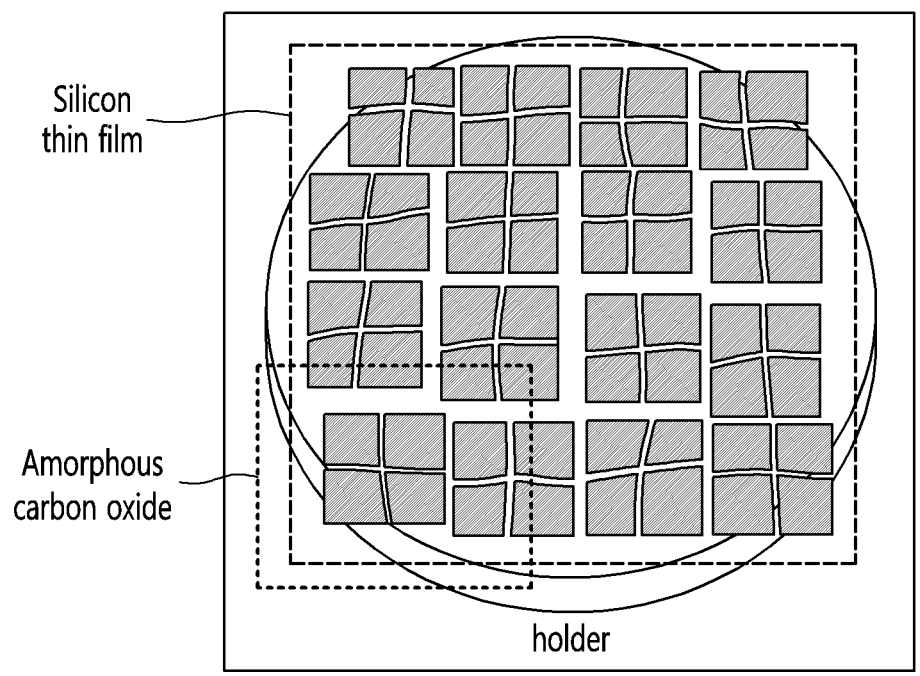
FIG. 4B illustrates a deposition degree according to use of the sputtering chamber of FIG. 4A.

FIG. 4A illustrates a sputtering chamber provided with a single target, and FIG. 4B illustrates a deposition degree according to use of the sputtering chamber of FIG. 4A.

Referring to FIGS. 4A and 4b, it can be confirmed that, when a substrate is disposed and deposited at a position corresponding, in a vertical direction, to a target, a-COx is not deposited from a part perpendicular to the target, so that a-COx is deposited only on a lower left part (amorphous carbon oxide) of the substrate.

Figure 5A:
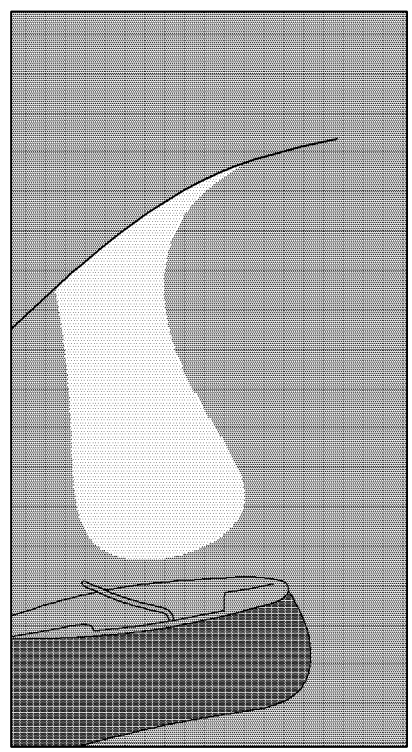
FIG. 5A illustrates a sputtering chamber in which a substrate is disposed under a target.
Figure 5B:
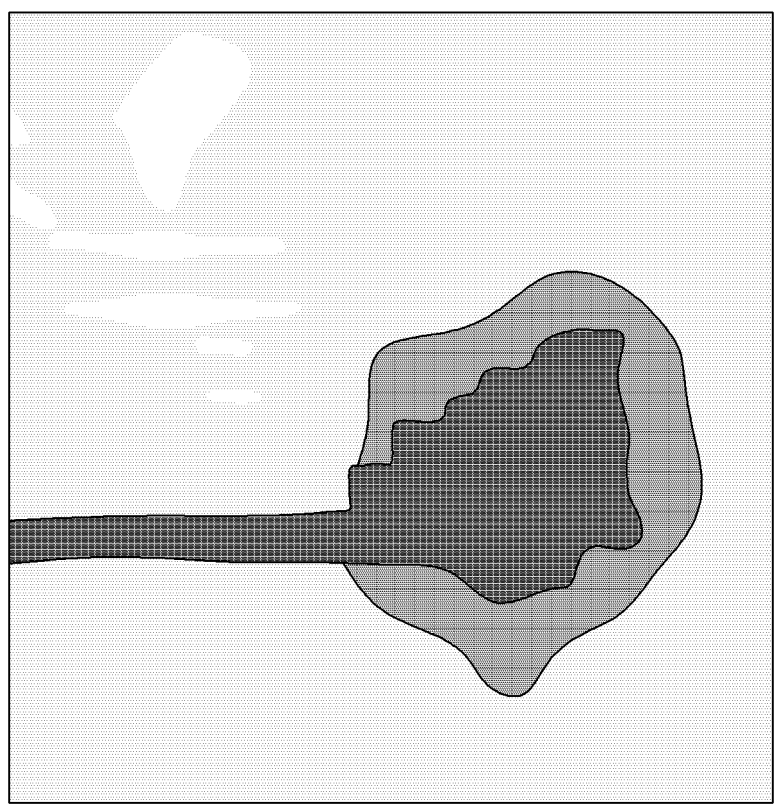
FIG. 5B illustrates a sputtering chamber in which a substrate is disposed on a side of a target.
Figure 5C:
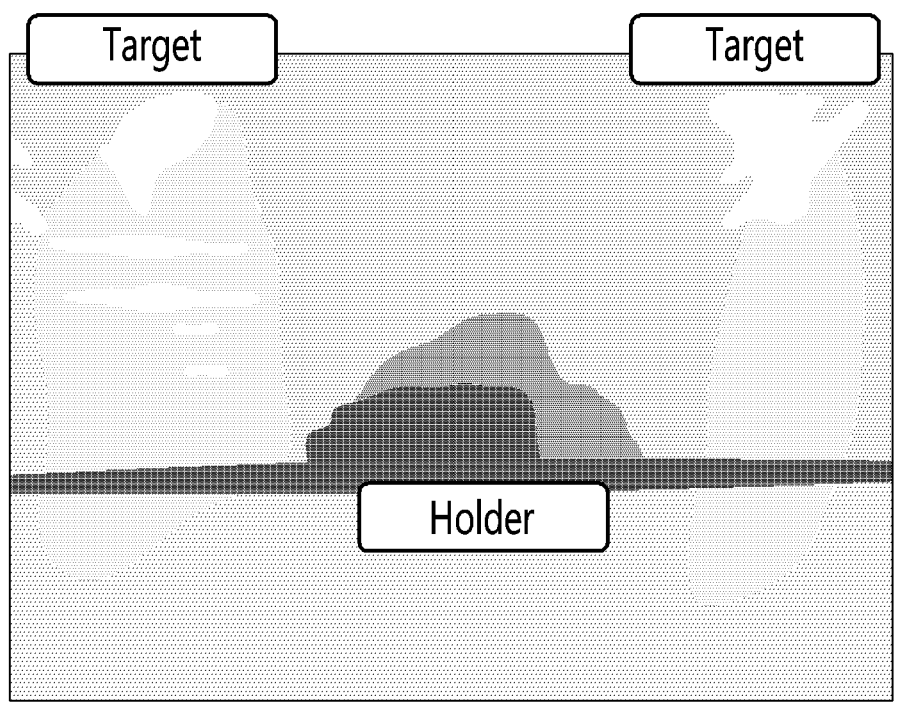
FIG. 5C illustrates a sputtering chamber in which a substrate is disposed between a first target and a second target.

FIG. 5A illustrates a sputtering chamber in which a substrate is disposed under a target, FIG. 5B illustrates a sputtering chamber in which a substrate is disposed on a side of a target, and FIG. 5C illustrates a sputtering chamber in which a substrate is disposed between a first target and a second target.

Referring to FIGS. 5A to 5C, by the method of fabricating a resistive switching memory according to Example 1 of the present invention, a resistive switching layer is deposited using a sputtering chamber wherein a substrate is disposed between a first target and a second target, as shown in FIG. 5C.

Figure 6A:
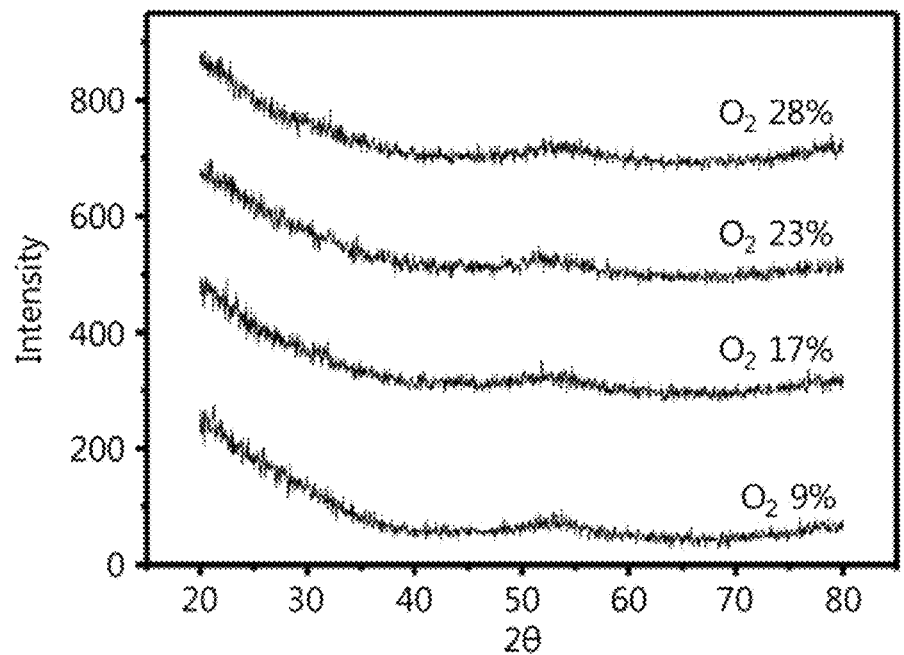
FIG. 6A illustrates X-ray Diffraction Spectroscopy (XRD) measurement results of a resistive switching layer deposited using a method of fabricating a resistive switching memory according to Example 1 of the present invention.
Figure 6B:
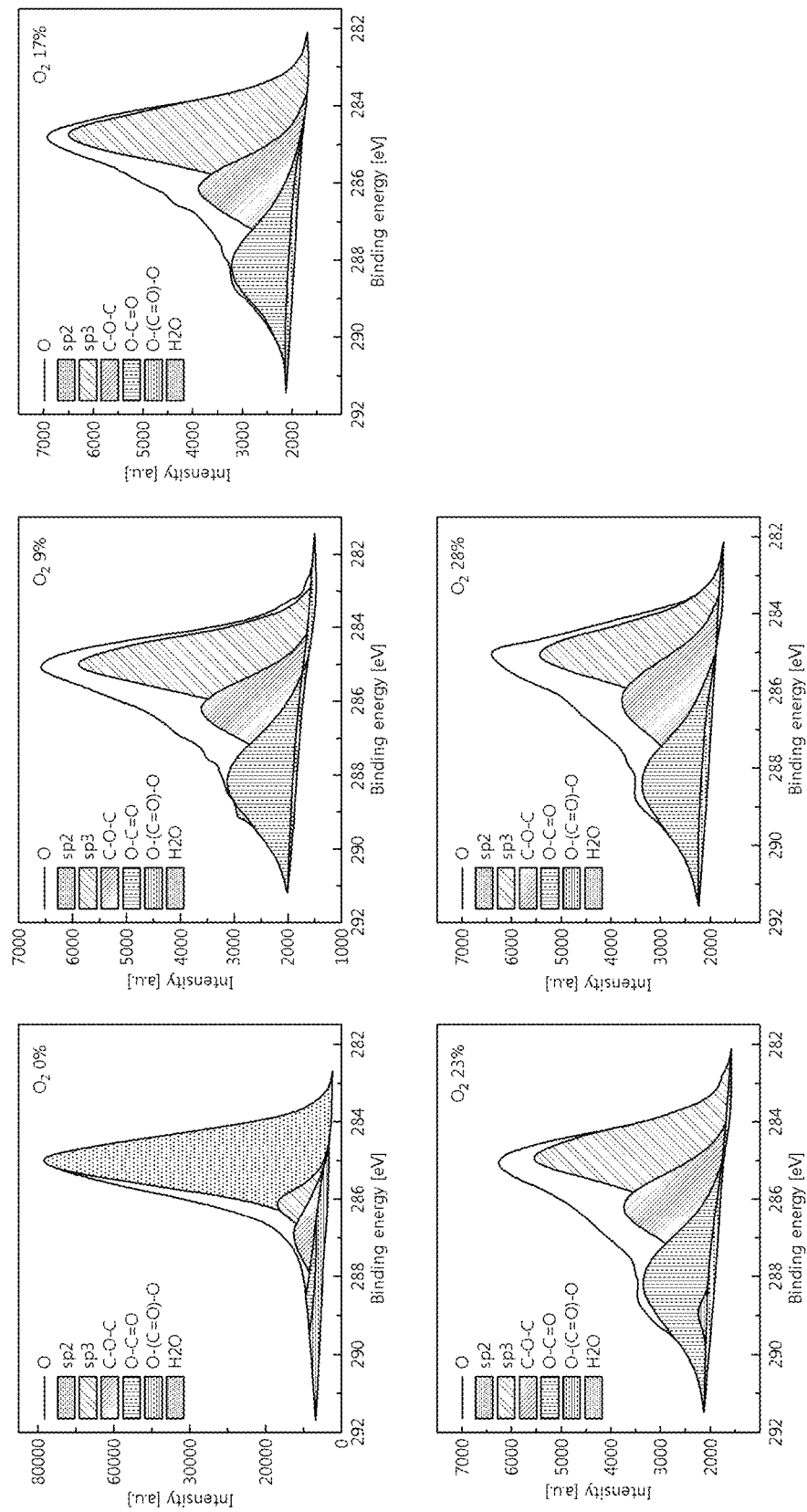
FIG. 6B illustrates X-ray Photoelectron Spectroscopy (XPS) measurement results of a resistive switching layer deposited using a method of fabricating a resistive switching memory according to Example 1 of the present invention.
Figure 6C:
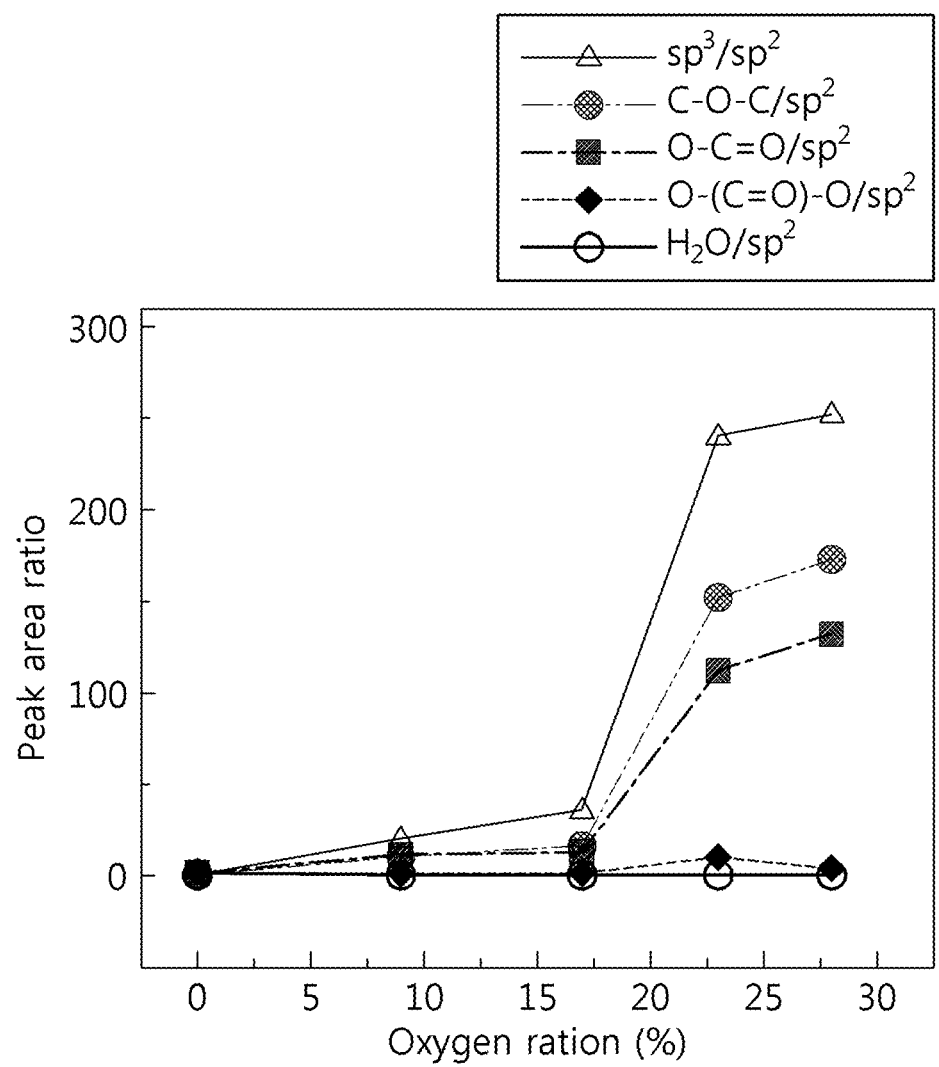
FIG. 6C illustrates oxygen ratio-dependent peak area ratios of a resistive switching layer deposited using a method of fabricating a resistive switching memory according to Example 1 of the present invention.

FIG. 6A illustrates X-ray Diffraction Spectroscopy (XRD) measurement results of a resistive switching layer deposited using a method of fabricating a resistive switching memory according to Example 1 of the present invention, FIG. 6B illustrates X-ray Photoelectron Spectroscopy (XPS) measurement results of a resistive switching layer deposited using a method of fabricating a resistive switching memory according to Example 1 of the present invention, and FIG. 6C illustrates oxygen ratio-dependent peak area ratios of a resistive switching layer deposited using a method of fabricating a resistive switching memory according to Example 1 of the present invention.

Referring to FIG. 6A, it can be confirmed that the resistive switching layer deposited by the method of fabricating a resistive switching memory according to Example 1 of the present invention has an amorphous phase. Referring to FIG. 6B, it can be confirmed that the resistive switching layer deposited by the method of fabricating a resistive switching memory according to Example 1 of the present invention is carbon oxide. Referring to FIG. 6C, it can be confirmed that a thin film composition of the resistive switching layer, deposited by the method of fabricating a resistive switching memory according to Example 1 of the present invention, is a-COx changed into C—O according to oxygen partial pressure.

Accordingly, referring to FIGS. 6A to 6C, it can be confirmed that the resistive switching layer deposited by the method of fabricating a resistive switching memory according to Example 1 of the present invention is satisfactorily formed in the form of a-COx having an amorphous phase.

In addition, it can be confirmed that a C—O binding energy ratio in the resistive switching layer, deposited by the method of fabricating a resistive switching memory according to Example 1 of the present invention, increases depending upon oxygen partial pressure.

Figure 7:
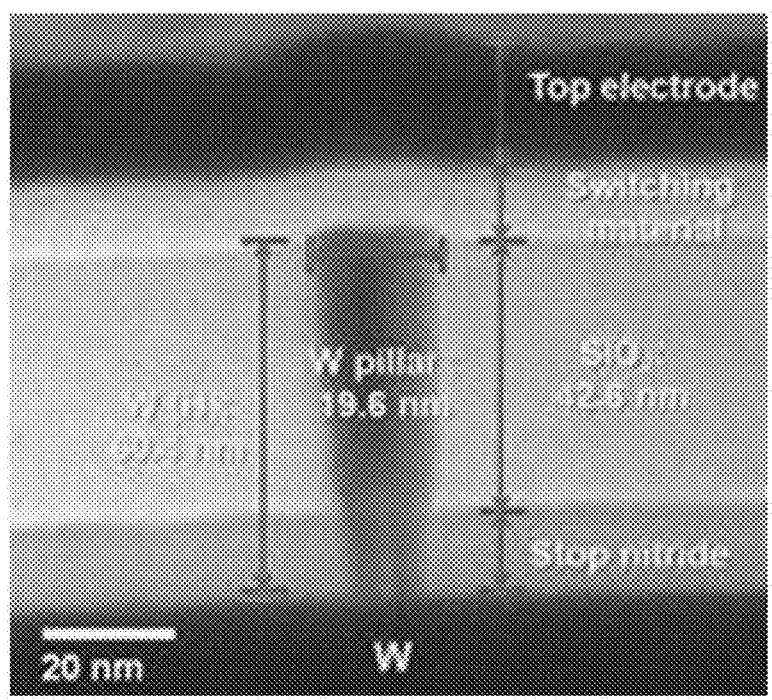
FIG. 7 illustrates a Scanning Electron Microscope (SEM) image of a resistive switching memory according to Example 1 of the present invention.

FIG. 7 illustrates a Scanning Electron Microscope (SEM) image of a resistive switching memory according to Example 2 of the present invention.

Referring to FIG. 7, it can be confirmed that the resistive switching memory according to Example 2 of the present invention is satisfactorily formed.

Figure 8B:
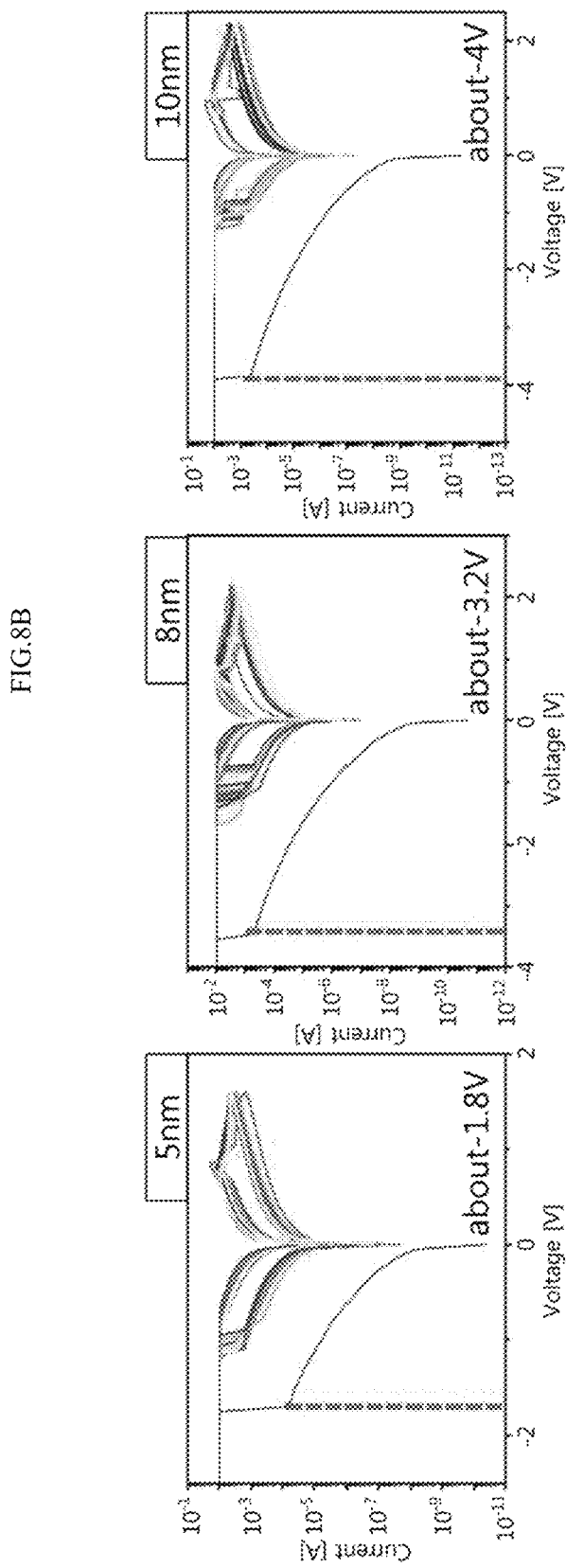
FIG. 8B illustrates resistive switching layer thickness-dependent forming voltages of a resistive switching memory according to Example 2 of the present invention.

FIG. 8A illustrates cell size-dependent forming voltages of a resistive switching memory according to Example 2 of the present invention, and FIG. 8B illustrates resistive switching layer thickness-dependent forming voltages of a resistive switching memory according to Example 2 of the present invention.

Referring to FIG. 8A, it can be confirmed that a resistance change in a localization filament of the resistive switching memory according to Example 2 of the present invention occurs depending upon a cell size.

Referring to FIG. 8B, it can be confirmed that a forming voltage increases depending upon the thickness of a resistive switching layer of the resistive switching memory according to Example 2 of the present invention so as to satisfy V=Ed.

Figure 9:
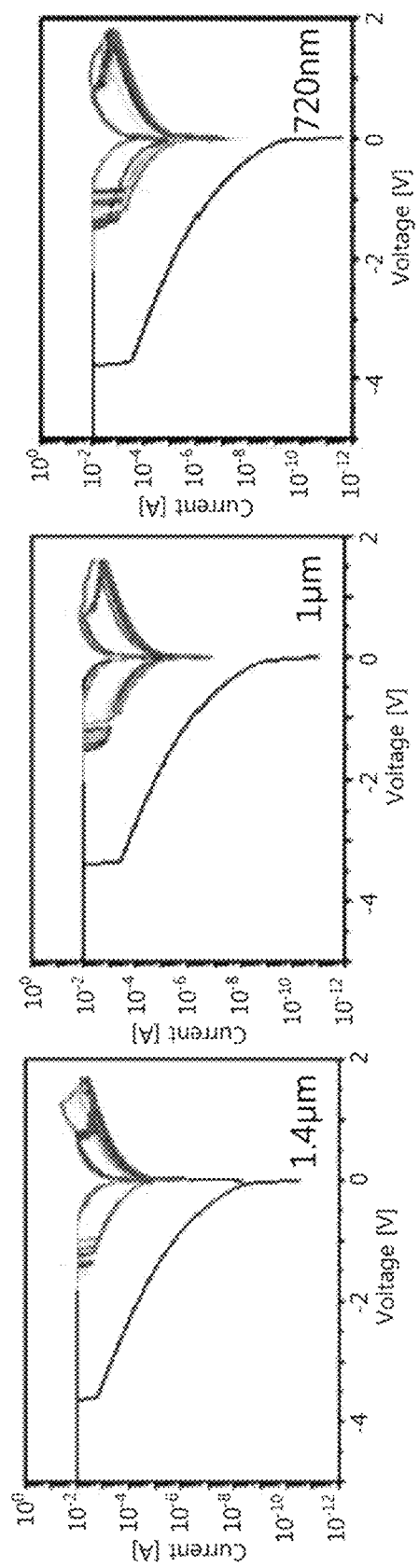
FIG. 9 illustrates current-voltage measurement results of a resistive switching memory according to Example 2 of the present invention which are dependent upon a second distance, in a vertical direction, between a first target and a substrate and between a second target and the substrate.

FIG. 9 illustrates current-voltage measurement results of a resistive switching memory according to Example 2 of the present invention which are dependent upon a second distance, in a vertical direction, between a first target and a substrate and between a second target and the substrate.

Referring to FIG. 9, 10 sccm of argon and 2 sccm of oxygen were flowed and 170 W of power was applied during sputtering so as to have an oxygen concentration state of 17%, thereby forming a resistive switching layer.

Referring to FIG. 9, it can be confirmed that switching speeds of the resistive switching memories according to Examples 1 and 2 of the present invention are controlled according to the second distance, in a vertical direction, between the first and second targets and the substrate.

Figure 10A:
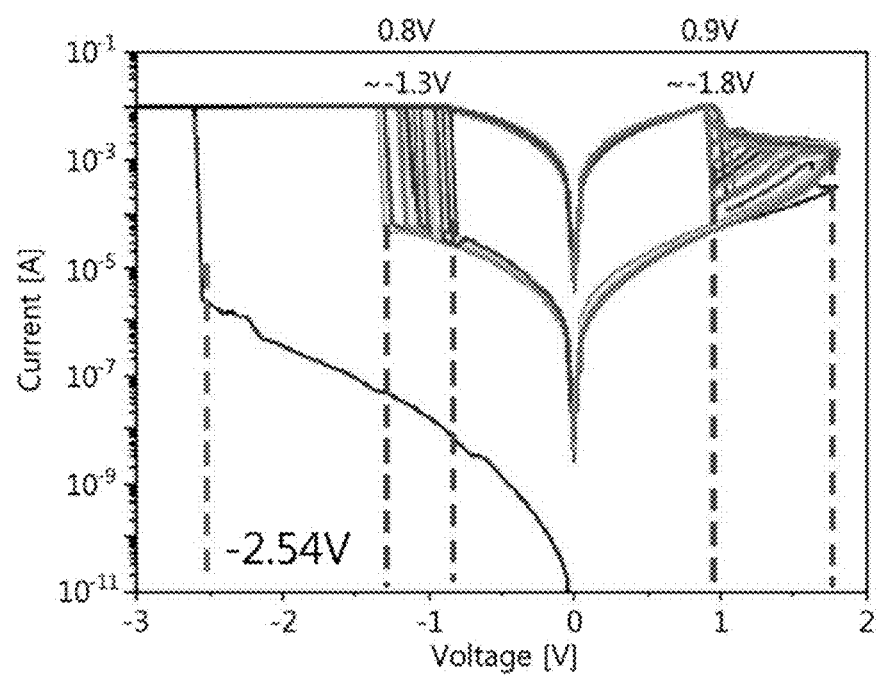
FIG. 10A illustrates a current-voltage measurement result of a resistive switching memory according to Example 2 of the present invention.
Figure 10B:
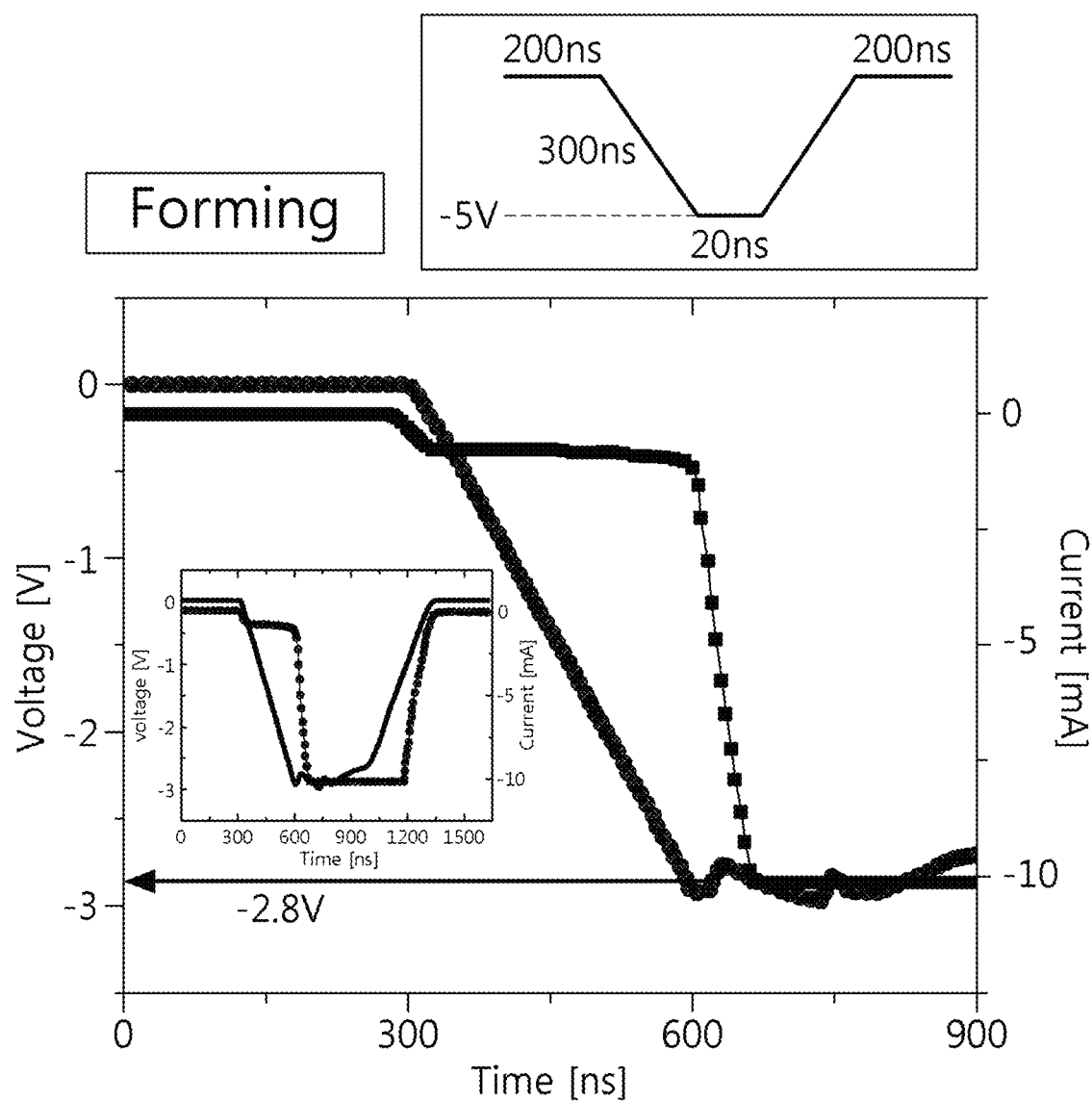
FIG. 10B illustrates a voltage-time measurement result of a resistive switching memory according to Example 2 of the present invention in a forming state.
Figure 10C:
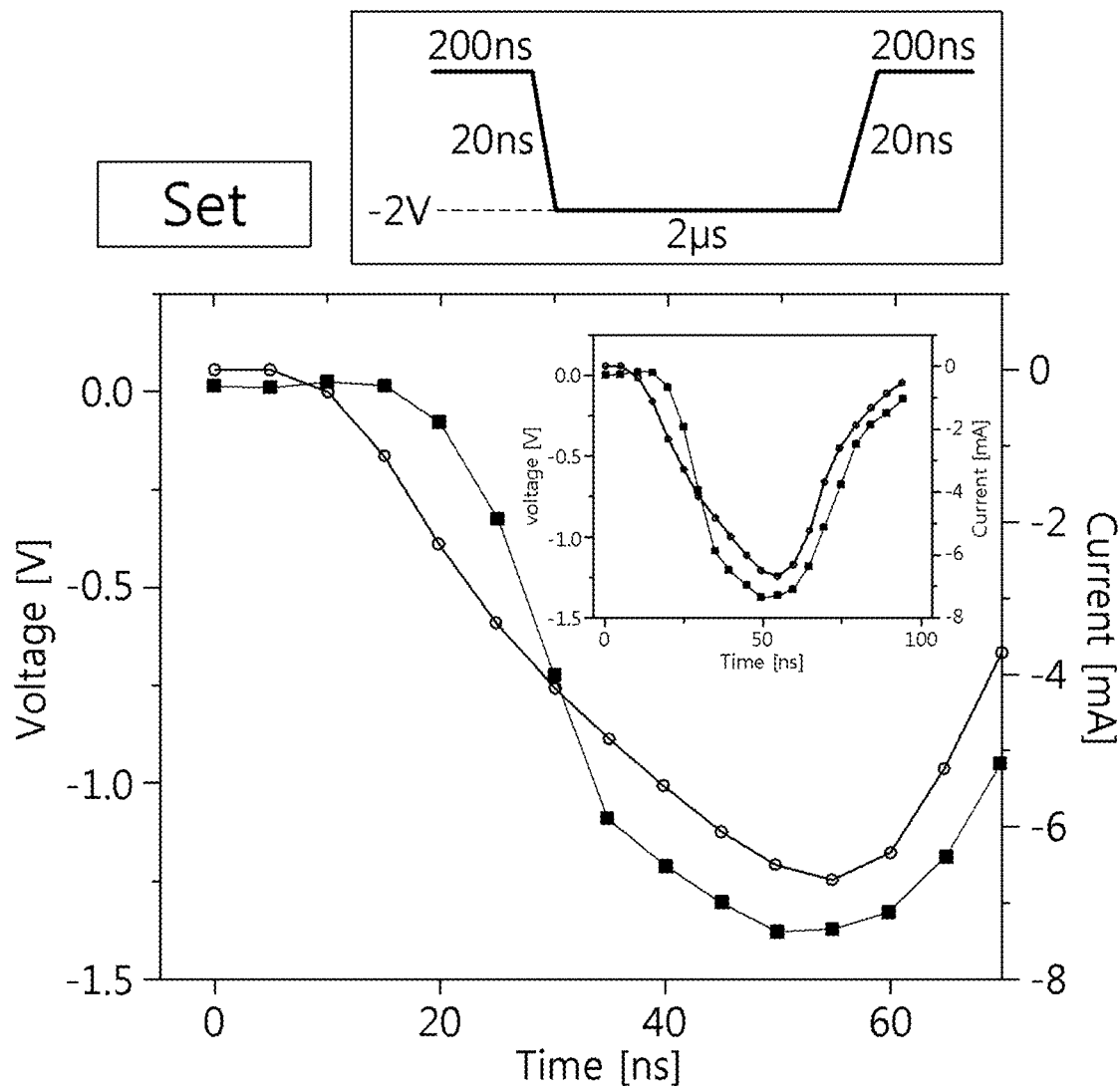
FIG. 10C illustrates a voltage-time measurement result of a resistive switching memory according to Example 2 of the present invention in a set state.
Figure 10D:
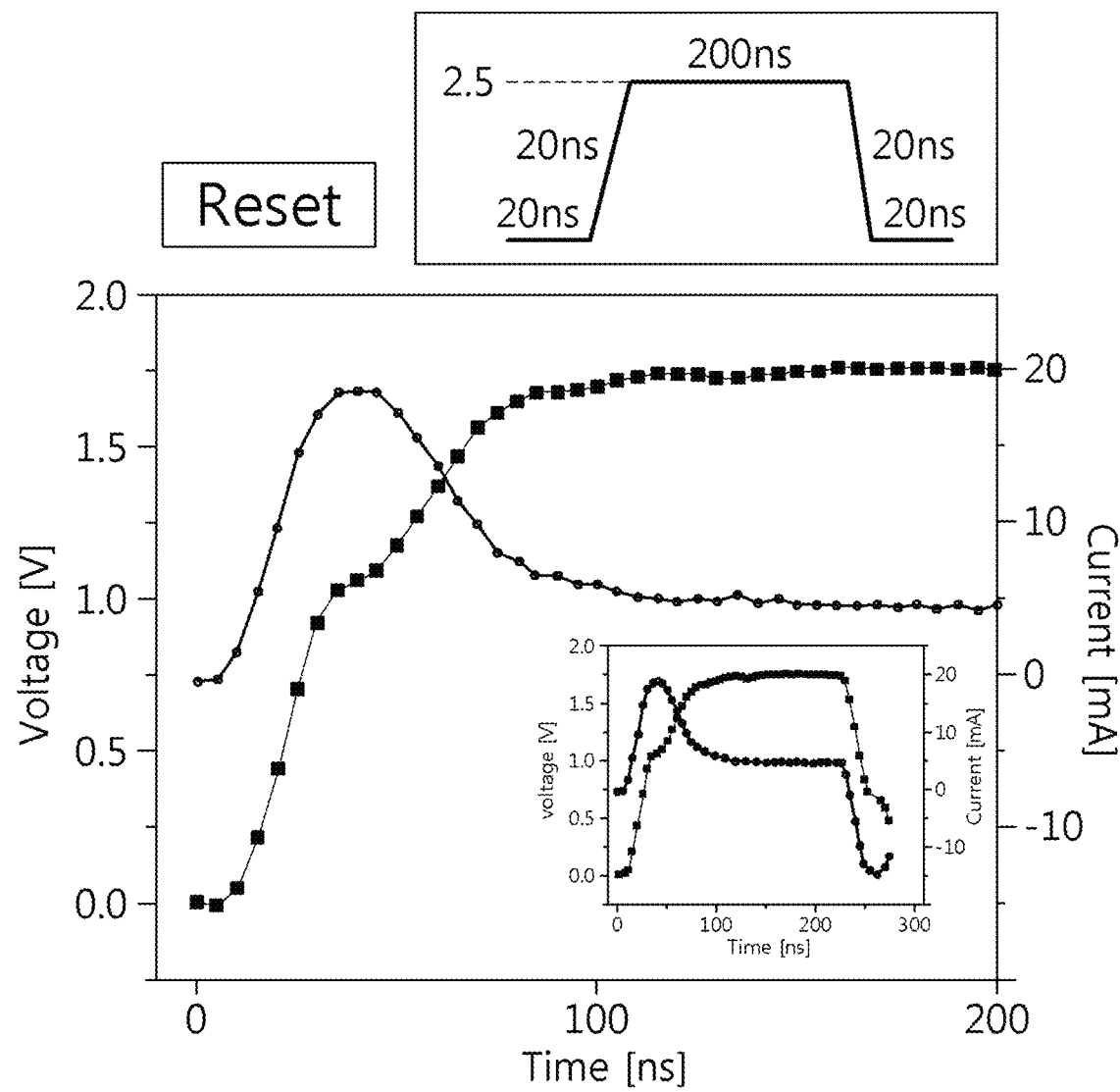
FIG. 10D illustrates a voltage-time measurement result of a resistive switching memory according to Example 2 of the present invention in a reset state.

FIG. 10A illustrates a current-voltage measurement result of a resistive switching memory according to Example 2 of the present invention, FIG. 10B illustrates a voltage-time measurement result of a resistive switching memory according to Example 2 of the present invention in a forming state, FIG. 10C illustrates a voltage-time measurement result of a resistive switching memory according to Example 2 of the present invention in a set state, and FIG. 10D illustrates a voltage-time measurement result of a resistive switching memory according to Example 2 of the present invention in a reset state.

Referring to FIGS. 10A to 10D, I-V Curve was measured at DC & pulse to investigate the characteristics of the resistive switching memories. In addition, referring to FIGS. 10A to 10D, 10 sccm of argon and 2 sccm of oxygen were flowed and 170 W of power was applied during sputtering so as to have an oxygen concentration state of 17%, thereby forming a resistive switching layer. Here, DC sweep was 720 nm.

Referring to FIGS. 10A to 10D, it can be confirmed that I-V characteristics, such as forming at −2.54V, reset at 0.9V to 1.8V, and set at −0.8V to −1.3V, are exhibited.

In addition, it can be confirmed that the resistive switching memories exhibit electrical characteristics from the pulse measurement results.

Accordingly, it can confirmed that the resistive switching memory according to Example 2 of the present invention exhibits a fast switching speed of 20 ns or less.

Meanwhile, embodiments of the present invention disclosed in the present specification and drawings are only provided to help understanding of the present invention and the scope of the present invention is not limited to the embodiments. It will be apparent to those skilled in the art that various modifications can be made to the above-described exemplary embodiments of the present invention without departing from the spirit or scope of the invention.

DESCRIPTION OF SYMBOLS

| 101: resistive switching memory | 110: substrate |
| 120: first insulating layer | 130: lower electrode |
| 140: photoresist | 150: resistive switching layer |
| 160: upper electrode | 210: sputtering chamber |
| 220: holder | 231 first target |
| 232: second target | 241: first plasma density |
| 242: second plasma density | 243: second plasma density |

The invention claimed is:

1. A method of fabricating a Resistive Random Access Memory (ReRAM), the method comprising:
   a step of forming a lower electrode on a substrate;
   a step of forming a resistive switching layer on the lower electrode using sputtering; and
   a step of forming an upper electrode on the resistive switching layer,
   wherein, in the step of forming a resistive switching layer on the lower electrode using sputtering, the substrate is disposed in a region, which is not reached by plasma generated by a first target and a second target, between the first target and the second target that are disposed above the substrate to deposit the resistive switching layer,
   wherein, in the step of forming a resistive switching layer on the lower electrode using sputtering, a thickness of the resistive switching layer is controlled to 5 nm to 20 nm by adjusting a density of plasma applied to the substrate,
   wherein the density of plasma applied to the substrate is $10^{13}$ ions/m$^3$ to $10^{17}$ ions/m$^3$.

2. The method according to claim 1, wherein a deposition rate of the resistive switching layer is controlled by adjusting a first distance, in a horizontal direction, between the first or second target and the substrate.

3. The method according to claim 2, wherein the first distance, in a horizontal direction, between the first or second target and the substrate is 1 cm to 5 cm.

4. The method according to claim 1, wherein a deposition rate of the resistive switching layer is controlled by adjusting a second distance, in a vertical direction, between the first or second target and the substrate.

5. The method according to claim 4, wherein the second distance, in a vertical direction, between the first or second target and the substrate is 5 cm to 20 cm.

6. The method according to claim 1, wherein the step of forming a resistive switching layer on the lower electrode using sputtering is carried out in an oxygen atmosphere.

7. The method according to claim 1, wherein the first target and the second target are made of a same material.

8. The method according to claim 1, wherein the first and second targets comprises at least one of graphite, carbon (C), silicon (Si), copper (Cu), nickel (Ni), titanium (Ti), hafnium (Hf), zirconium (Zr), zinc (Zn), tungsten (W), cobalt (Co), niobium (Nb), magnesium (Mg), oxygenated carbon (COx), silicon oxide, copper oxide, nickel oxide, titanium oxide, hafnium oxide, zirconium oxide, zinc oxide, tungsten oxide, cobalt oxide, niobium oxide and magnesium oxide.

9. The method according to claim 1, wherein the resistive switching layer comprises at least one of oxygenated carbon (COx) and metal oxide.

10. The method according to claim 1, wherein the lower and upper electrodes comprise at least one of titanium nitride (TiN), tantalum nitride (TaN), tungsten (W), platinum (Pt), aluminum (Al), silver (Ag), copper (Cu) and ruthenium (Ru).

\* \* \* \* \*